(12) United States Patent
An et al.

(10) Patent No.: US 6,479,868 B1
(45) Date of Patent: Nov. 12, 2002

(54) SILICON-ON-INSULATOR TRANSISTORS WITH ASYMMETRIC SOURCE/DRAIN JUNCTIONS FORMED BY ANGLED GERMANIUM IMPLANTATION

(75) Inventors: Xilin Judy An, San Jose, CA (US); Bin Yu, Cupertino, CA (US); Concetta E. Riccobene, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,659

(22) Filed: Apr. 30, 2001

(51) Int. Cl.[7] ............................................... H01L 27/01
(52) U.S. Cl. ..................... 257/348; 257/344; 257/347; 257/386; 257/408; 438/149; 438/151; 438/682
(58) Field of Search ................................. 257/344, 347, 257/386, 408; 438/149, 151, 163, 233, 307

(56) References Cited

U.S. PATENT DOCUMENTS

| | | | |
|---|---|---|---|
| 5,578,865 A | 11/1996 | Vu et al. ...................... 257/611 |
| 5,686,735 A | 11/1997 | Sim ............................. 257/24 |
| 6,054,386 A | * 4/2000 | Prabhakar ................... 438/149 |
| 6,198,142 B1 | * 3/2001 | Chau et al. ................. 257/344 |
| 6,339,005 B1 | * 1/2002 | Bryant et al. ............... 438/163 |

* cited by examiner

Primary Examiner—Hoai Ho
Assistant Examiner—Mai-Huong Tran
(74) Attorney, Agent, or Firm—Renner, Otto, Boisselle & Sklar, LLP

(57) ABSTRACT

A silicon-on-insulator (SOI) transistor. The SOI transistor includes a germanium implanted source and drain having a body disposed therebetween, and a gate disposed on the body, the germanium being implanted at an angle such that the source has a concentration of germanium at a source/body junction and the gate shields germanium implantation in the drain adjacent a drain/body junction resulting in a graduated drain/body junction. Also disclosed is a method of fabricating the SOI transistor.

9 Claims, 2 Drawing Sheets

US 6,479,868 B1

SILICON-ON-INSULATOR TRANSISTORS WITH ASYMMETRIC SOURCE/DRAIN JUNCTIONS FORMED BY ANGLED GERMANIUM IMPLANTATION

TECHNICAL FIELD

The present invention relates generally to silicon-on-insulator (SOI) devices and methods of forming the same and, more particularly, to SOI devices and methods for forming which avoid or reduce floating body effects and reduce junction capacitance.

BACKGROUND ART

Silicon-on-insulator (SOI) materials offer potential advantages over bulk materials for the fabrication of high performance integrated circuits. Dielectric isolation and reduction of parasitic capacitance improve circuit performance, and virtually eliminate latch-up in CMOS circuits. In addition, circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body ("floating body effects"). These floating body effects may result in undesirable performance in SOI devices.

It will be appreciated from the foregoing that a need exists for SOI MOSFETs having reduced floating body effects.

In addition, reducing junction capacitance in SOI devices is also desirable to, in part, increase the switching speed of the device.

SUMMARY OF THE INVENTION

According to one aspect of the invention, the invention is a silicon-on-insulator (SOI) transistor. The SOI transistor includes a germanium implanted source and drain having a body disposed therebetween, and a gate disposed on the body, the germanium being implanted at an angle such that the source has a concentration of germanium at a source/body junction and the gate shields germanium implantation in the drain adjacent a drain/body junction resulting in a graduated drain/body junction.

According to another aspect of the invention, the invention is a method of fabricating a silicon-on-insulator (SOI) transistor. The method includes the steps of providing an active layer disposed on a buried oxide (BOX) layer, the BOX layer being disposed on a substrate, the active layer having an active region defined by isolation regions; forming a transistor in the active region, the transistor having a source and a drain having a body disposed therebetween, and a gate disposed on the body; and implanting the transistor with germanium, the germanium implanted at an angle such that a concentration of germanium is present at a source/body junction and the gate shields germanium implantation in the drain adjacent a drain/body junction resulting in a graduated drain/body junction.

According to another aspect of the invention, the invention is a silicon-on-insulator (SOI) transistor. The SOI transistor includes a source and drain having a body disposed therebetween, and a gate disposed on the body, the source and drain implanted with atoms selected from silicon, argon, krypton and xenon, the atoms being implanted at an angle such that the source has a concentration of atoms at a source/body junction and the gate shields atom implantation in the drain adjacent a drain/body junction resulting in a graduated drain/body junction.

BRIEF DESCRIPTION OF DRAWINGS

These and further features of the present invention will be apparent with reference to the following description and drawings, wherein.

DISCLOSURE OF INVENTION

Figure 1:
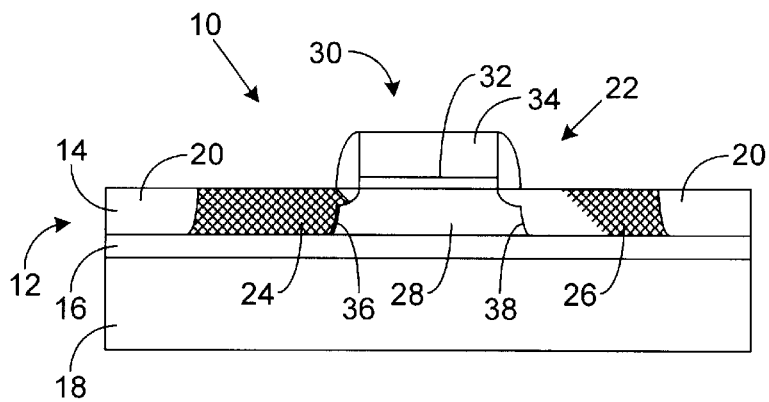
FIG. 1 is a cross-section of a silicon-on-insulator (SOI) device according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring to FIG. 1, a silicon-on-insulator (SOI) device 10, also referred to herein as a transistor 10, is fabricated on an SOI wafer 12 which has a silicon active layer 14 disposed on a buried oxide (BOX) layer 16. The BOX layer 16 is disposed on a silicon substrate 18. Within the active layer 14, shallow trench isolation (STI) regions 20 define the placement of active regions 22 used for the fabrication of active devices, such as the device 10 described more fully below.

The device 10 has a source 24 and a drain 26 with a body 28 disposed therebetween. Disposed on top of the body 28 is a gate 30. The gate 30 includes a layer of gate oxide 32 and a polysilicon gate portion 34, or other gate stack formation, as is known in the art.

The device 10 is implanted with germanium (Ge). The germanium is implanted at an angle so as to form asymmetric junctions between the source and body and between the drain and body. More specifically, the germanium is implanted at about a 40 to about a 60 degree angle from vertical and tilted toward the source 24 side of the device 10. The shaded portions of the source 24 and drain 26 in FIG. 1 represent the portions of the source 24 and the drain 26 in which germanium is implanted. The germanium is implanted across almost all of the source 24. The angle of implantation causes a high concentration of germanium to be implanted at a source/body junction 36, especially in the portion of the source/body junction 36 below an extension 62 (FIG. 3C), resulting in the source/body junction being abrupt. For example, the atomic concentration of silicon adjacent the source/body junction 36 below the extension 62 (FIG. 3E) is about 30% to about 70% and the atomic concentration of germanium in the same area is about 30% to about 70%. In addition, the implanted germanium amorphizes the silicon. The resulting source/body junction 36 is a tunneling junction to remove charges in the body, thereby reducing floating body effects (FBE) and bipolar junction transistor (BJT) effects. In other words, the source side 24 of the device 10 is leaky so that body accumulated charges are removed from the body.

On the drain 26 side, the gate 30 acts to shield the germanium such that a drain/body junction 38 has a graduated germanium concentration. More specifically, the portion of the drain 26 distal the body is more heavily doped with germanium than in the areas of the drain 26 adjacent the body 28. The result is a less abrupt drain/body junction 38 relative to the source/body junction 36. This graduated junction acts to reduce junction capacitance of the device 10. Reduced junction capacitance helps to increase the switching speed of the device 10.

In alternative embodiments, the implanted germanium can be replaced with implanted silicon (Si), xenon (Xe), krypton (Kr) or Argon (Ar). Similar to the germanium, these elements tend to cause amorphization of the silicon in the source and create an abrupt source/body junction 36 which acts to reduce floating body effects.

Figure 2:
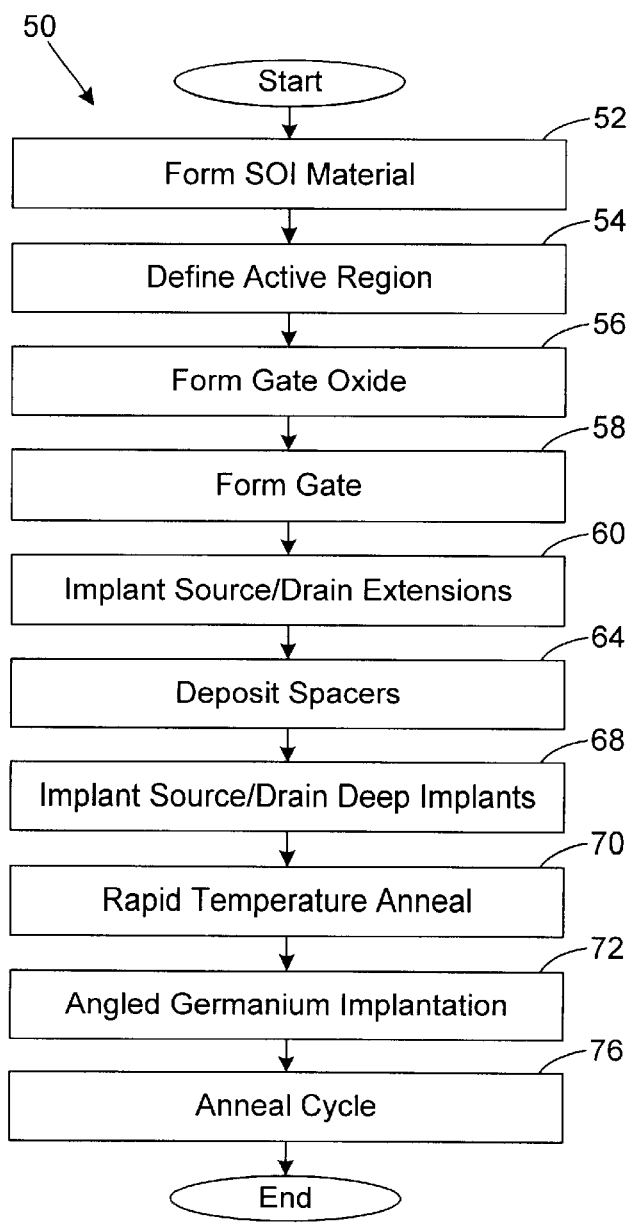
FIG. 2 is a flow chart illustrating a method of fabricating the SOI device of FIG. 1.
Figure 3A:
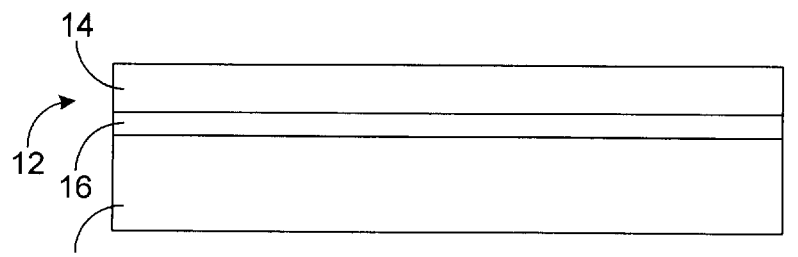
FIGS. 3A–3E are cross-sections of the SOI device of FIG. 1 in intermediate stages of fabrication.

Referring now to FIG. 2, a method 50 of fabricating the device 10 illustrated in FIG. 1 is shown in flowchart format. With additional reference to FIG. 3A, the method 50 begins in step 52 where a wafer 12 of SOI material is formed. As mentioned, the wafer 12 has a silicon substrate 18 with a buried oxide (BOX) layer 16 disposed thereon. Disposed on the BOX layer 16 is a silicon active layer 14. The active layer 14 may be initially doped for the fabrication of N-channel or P-channel devices.

Figure 3B:
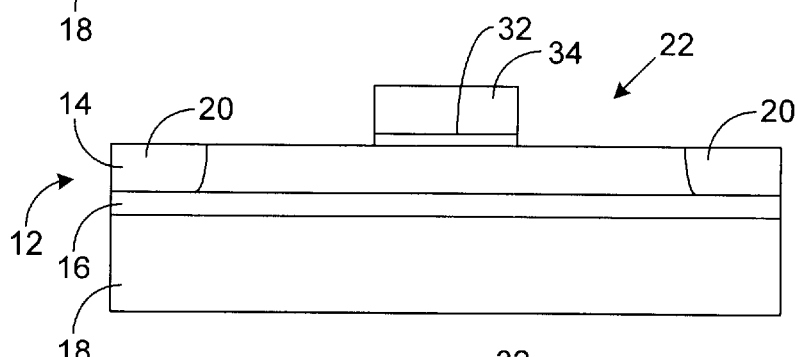

Next, in step 54 and as illustrated in FIG. 3B, the active region 22 is defined. More specifically, STI regions 20 are formed to define the size and placement of the active region 22. Next, in step 56, the gate oxide layer 32 is formed using conventional techniques. Next, in step 58, the polysilicon gate portion 34, along with any other desired gate layers to form the gate stack, are formed on the gate oxide 32 using conventional techniques.

Figure 3C:
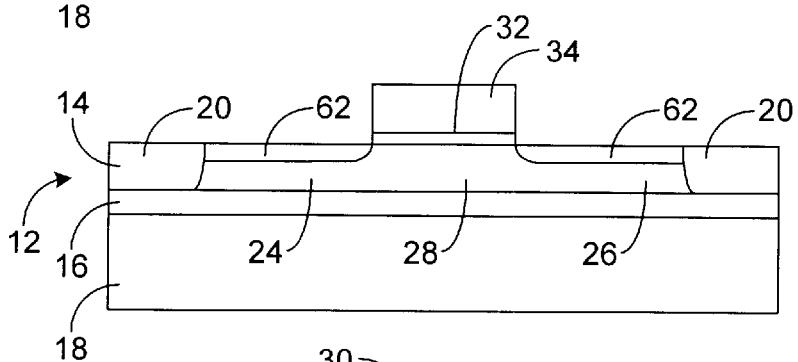

Next, in step 60, and as illustrated in FIG. 3C, source 24 and drain 26 extensions 62 are implanted. For an P-channel device, N-type extensions 62 are formed by implanting arsenic (As+) at, for example, an energy of about 1.0 kev to about 3.0 kev. For a N-channel device, P-type extensions 62 are formed by implanting boron (B+) at, for example, an energy of about 0.3 kev to about 1.5 kev. Regardless of the channel type, the implantation dose for the extensions 62 is, for example, about $1\times10^{14}$ atom/cm$^2$ to about $1\times10^{15}$ atoms/cm$^2$.

Figure 3D:
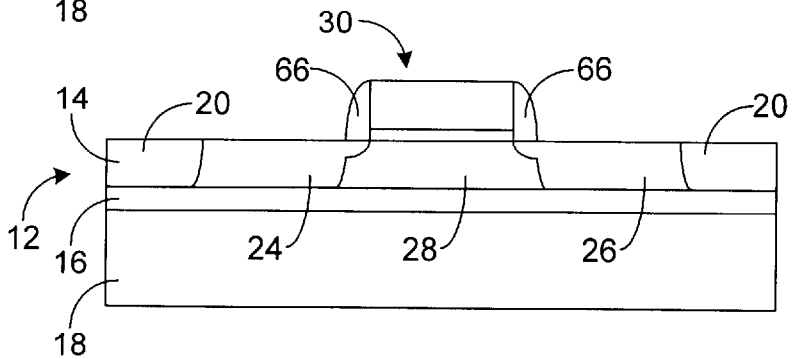

Next, in step 64 and as illustrated in FIG. 3D, side wall spacers 66 are formed adjacent the gate 30. The spacers are formed using conventional techniques and are made from a material such as silicon oxide (SiO$_2$) or a nitride (e.g., Si$_3$Na$_4$).

With continued reference to FIG. 2 and FIG. 3D, the source 24 and drain 26 are further defined by source/drain deep implantation in step 68. For an P-channel device, N-type deep implantation is made by implanting arsenic at, for example, an energy of about 5 kev to about 30 kev and a dose of about $1\times10^{15}$ atoms/cm$^2$ to about $5\times10^{15}$ atoms/cm$^2$. For a N-channel device, P-type deep implantation is made by implanting boron at, for example, an energy of about 3 kev to about 15 kev and a dose of about $1\times10^{15}$ atoms/cm$^2$ to about $5\times10^{15}$ atoms/cm$^2$. As one skilled in the art will appreciate, the source/drain extensions 62 and source/drain deep implantation can be carried out using alternative dopants (e.g., phosphorous and/or indium) and/or at other appropriate energy levels and dose levels, as is desirable for the device being fabricated. Following deep implantation in step 68, in step 70, the wafer 12 is subjected to a thermal anneal cycle at about 1,000° C. to about 1,150° C. for a period of about five seconds to about fifteen seconds or, alternatively, a rapid temperature anneal (RTA) cycle for about 0.1 seconds to about five seconds.

Figure 3E:
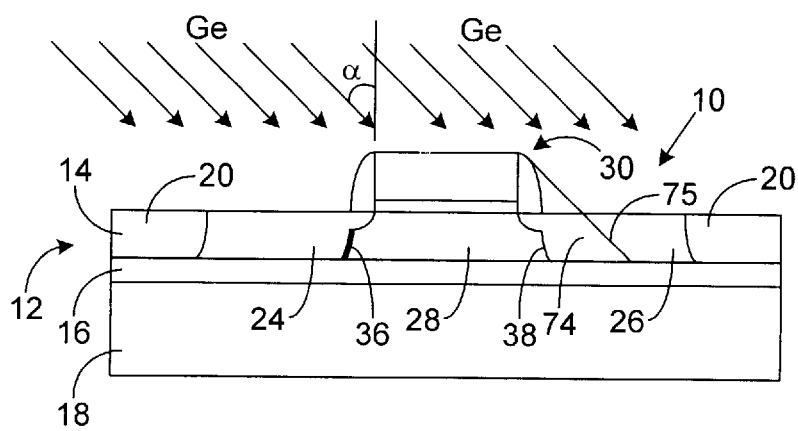

Next, in step 72 and as illustrated in FIG. 3E, the device 10 is subjected to tilted angle germanium implantation. The germanium is implanted, in one embodiment, with an energy of about 20 keV to about 80 keV and a dose of about $1\times10^{14}$ atoms/cm$^2$ to about $1\times10^{16}$ atoms/cm$^2$, and, in another embodiment, with an energy of about 10 keV to about 50 keV and a dose of about $5\times10^{14}$ atoms/cm$^2$. The germanium is implanted at an angle a of about 40 degrees to about 60 degrees from vertical and tilted towards the source 24. The tilted angle germanium implantation dopes the source 24 such that the source/body junction 36 is an abrupt junction, especially along the source/body junction 36 below the extension 62 as indicated by the darker line in FIG. 3E. As a result, the source/body junction 36 is a tunneling junction which allows charges to be removed from the body 28 thereby reducing floating body effects and other parasitic characteristics of the device 10. As indicated above, silicon, xenon, krypton or argon atoms can be used as alternatives to germanium.

The gate 30 acts to shield portions of the drain 26 from the germanium implantation. However, germanium will be implanted in higher concentrations in shaded portion (FIG. 1) of the drain 26 distal the drain/body junction 38. Relatively low amounts of germanium will be implanted in a shadow region 74 (demarked by shadow line 75 in FIG. 3E) caused by the gate 30. This non-abrupt junction, or graduated drain/body junction 38, results in a smaller junction capacitance of the device 10. As a result of the tilted angle implantation, the device 10 has asymmetric source and drain junctions 36 and 38 which act to reduce floating body effects and to reduce junction capacitance of the device 10.

Amorphization of the silicon of the source 24 and the drain 26 is caused by the implanted germanium. Thus, in step 76, the wafer 12 is subjected to a thermal cycle, or anneal cycle, to re-crystallize the germanium doped silicon of the active layer 14. More specifically, the thermal cycle is a low temperature furnace anneal of about 500° C. to about 600° C. for a period of about one minute to about ten minutes, or alternatively a rapid temperature anneal for about 0.1 seconds to about five seconds.

Although particular embodiments of the invention have been described in detail, it is understood that the invention is not limited correspondingly in scope, but includes all changes, modifications and equivalents coming within the spirit and terms of the claims appended hereto.

For example, the drain 26 can be masked before step 72 to prevent or minimize germanium implantation into the drain 26. Alternatively, the germanium may be vertically implanted and the drain 26 could be partially masked adjacent the drain/body junction 38 to achieve partial germanium implantation of the drain 26 in an area distal the drain/body junction 38.

What is claimed is:

1. A silicon-on-insulator (SOI) transistor, comprising a germanium implanted source and drain having a body disposed therebetween, and a gate disposed on the body, the germanium being implanted at an angle tilted towards the source and after source and drain dopant implantation such that the source has a concentration of germanium at a source/body junction and the gate shields germanium implantation in the drain adjacent a drain/body junction resulting in a graduated drain/body junction where a portion of the drain distal the body is more heavily doped with germanium than a portion of the drain adjacent the body, the source/body junction forming a tunneling junction and the graduated drain/body junction effective to reduce junction capacitance.

2. The SOI transistor according to claim 1, wherein the angle is about 40 to about 60 degrees from vertical tilted towards the source.

3. The SOI transistor according to claim 1, wherein the germanium dose is about $1 \times 10^{14}$ atoms/cm$^2$ to about $1 \times 10^{16}$ atoms/cm$^2$.

4. The SOI transistor according to claim 1, wherein the SOI transistor is subjected to an anneal cycle following germanium implantation.

5. A silicon-on-insulator (SOI) transistor, comprising a source and drain having a body disposed therebetween, and a gate disposed on the body, the source and drain implanted with atoms selected from silicon, argon, krypton and xenon, the atoms being implanted at an angle titled towards the source and after source and drain dopant implantation such that the source has a concentration of atoms at a source/body junction and the gate shields atom implantation in the drain adjacent a drain/body junction resulting in a graduated drain/body junction where a portion of the drain distal the body is more heavily doped with germanium than a portion of the drain adjacent the body, the source/body junction forming a tunneling junction and the graduated drain/body junction effective to reduce junction capacitance.

6. The SOI transistor according to claim 5, wherein the source/body junction is an abrupt junction.

7. The SOI transistor according to claim 5, wherein the angle is about 40 to about 60 degrees from vertical tilted towards the source.

8. The SOI transistor according to claim 5, wherein the SOI transistor is subjected to an anneal cycle following atom implantation.

9. The SOI transistor according to claim 1, wherein the drain/body junction is less abrupt than the source/body junction.

* * * * *

UNITED STATES PATENT AND TRADEMARK OFFICE
CERTIFICATE OF CORRECTION

PATENT NO.   : 6,479,868 B1
DATED        : November 12, 2002
INVENTOR(S)  : An et al.

It is certified that error appears in the above-identified patent and that said Letters Patent is hereby corrected as shown below:

Column 5,
Line 11, replace "titled" with -- tilted --

Signed and Sealed this

Fourth Day of March, 2003

JAMES E. ROGAN
*Director of the United States Patent and Trademark Office*